(12) United States Patent
Fujimura

(10) Patent No.: US 7,709,295 B2
(45) Date of Patent: May 4, 2010

(54) METHOD OF MANUFACTURING SEMICONDUCTOR DEVICE

(75) Inventor: Takashi Fujimura, Chiba (JP)

(73) Assignee: Seikoi Instruments Inc. (JP)

( * ) Notice: Subject to any disclaimer, the term of this patent is extended or adjusted under 35 U.S.C. 154(b) by 265 days.

(21) Appl. No.: 11/699,793

(22) Filed: Jan. 30, 2007

(65) Prior Publication Data

US 2007/0184660 A1 Aug. 9, 2007

(30) Foreign Application Priority Data

Feb. 8, 2006 (JP) .............................. 2006-031211

(51) Int. Cl.
*H01L 21/00* (2006.01)
(52) U.S. Cl. ................ 438/114; 438/459; 257/E21.459
(58) Field of Classification Search ................. 438/118, 438/114, 459; 257/E21.238
See application file for complete search history.

(56) References Cited

U.S. PATENT DOCUMENTS

| 5,824,457 | A * | 10/1998 | Liu et al. ..................... 430/394 |
| 6,261,964 | B1 * | 7/2001 | Wu et al. ..................... 438/705 |
| 7,351,645 | B2 * | 4/2008 | Ohashi et al. ................ 438/465 |
| 2006/0055055 | A1 * | 3/2006 | Gross .......................... 257/779 |

* cited by examiner

*Primary Examiner*—Matthew Smith
*Assistant Examiner*—Jarrett J Stark
(74) *Attorney, Agent, or Firm*—Adams & Wilks

(57) ABSTRACT

In a method of manufacturing a semiconductor device, a passivation film made of a polyimide resin film is formed on a front surface of a semiconductor wafer including a scribe line and an outer circumferential portion. Thereafter, only the passivation film which is formed on the scribe line of the semiconductor wafer and on the outer circumferential portion of the semiconductor wafer is selectively removed. A protective tape is then bonded onto the front surface of the semiconductor wafer, followed by grinding of a rear surface of the semiconductor wafer.

15 Claims, 3 Drawing Sheets

Prior Art

METHOD OF MANUFACTURING SEMICONDUCTOR DEVICE

BACKGROUND OF THE INVENTION

1. Field of the Invention

The present invention relates to a method of manufacturing a semiconductor device, and more particularly, to a method of manufacturing a semiconductor device including a step of grinding a rear surface of a semiconductor wafer.

2. Description of the Related Art

A semiconductor device is manufactured such that a plurality of semiconductor chips each including a semiconductor element is formed on a front surface of a semiconductor wafer. Further, among the semiconductor chips being adjacent to each other on the semiconductor wafer, there are formed scribe lines along which the semiconductor wafer is cut into semiconductor chips in a dicing process. The semiconductor wafer has a thickness of about 500 to 900 µm to maintain certain rigidity in the manufacturing process. However, in a case where the semiconductor wafer is incorporated into a package as a chip, the semiconductor chip is required to have the thickness between 100 to 350 µm. For this reason, adopted is a method in which the semiconductor wafer is ground to obtain a desired thickness, and then the semiconductor wafer is cut vertically and horizontally along the scribe lines to separate.

As a method of thinning a semiconductor wafer, JP 05-335411 A discloses a method of manufacturing a semiconductor chip in which trenches each having a predetermined depth are formed on the front surface side of the semiconductor wafer, and then the rear surface side of the semiconductor wafer is ground.

Further, JP 2001-127029 A discloses a method of protecting the front surface of a semiconductor wafer with a surface protective sheet which includes a base material and an adhesive layer formed thereon, and has a stress relaxation rate of 40% or more in a minute to the tension of 10% in a tension test for surface protective sheet.

In a process of grinding the rear surface of the semiconductor wafer, surface protective tape is bonded to the front surface of the semiconductor wafer so as to protect the front surface of the semiconductor wafer, and then the rear surface of the semiconductor wafer is ground. After the rear surface of the semiconductor wafer is ground, the surface protective tape is removed.

In a case of using a polyimide resin film, the polyimide resin film must have a certain thickness to protect the semiconductor chip from damage or contamination. Besides removal of the polyimide resin film disposed on the scribe lines is necessary since the polyimide resin film disposed on the scribe lines deteriorates cutting performance of a dicing blade in dicing process.

The polyimide resin film is required to have a thickness of 4 µm or more, and each scribe line has a shape of a trench. As shown in FIG. 7, scribe lines 3 are formed in an outer-most circumferential portion of a semiconductor wafer 1. As shown in FIG. 6, a surface protective tape 6 does not fill each trench made by the scribe lines 3 on the front surface of the semiconductor wafer, which results in generating gaps 9 between the surface protective tape and each of the scribe lines formed on the front surface of the semiconductor wafer. As a result, when the rear surface of the semiconductor wafer is ground, grinding water enters from the gaps 9, and grinding swarf contaminates the scribe lines and the front surface of the semiconductor chip.

SUMMARY OF THE INVENTION

The present invention has been made in view of the above-mentioned problems, and an object of the present invention is to provide a method of manufacturing a semiconductor device including, in a step of preparing a semiconductor wafer including a plurality of semiconductor chip regions which is separated by scribe line regions, the outer circumferential portion of the semiconductor wafer and the surface protective tape are bonded to each other after removing the polyimide resin film disposed in the scribe line regions of the semiconductor wafer, and removing the polyimide resin film provided in an outer circumferential portion of the semiconductor wafer, thereby filling a gap between the surface protective tape and each scribe line formed on the front surface of the semiconductor wafer, and preventing penetration of grinding wafer into the gap when the rear surface of the semiconductor wafer is ground, and also preventing the scribe lines and the front surface of the semiconductor chip from being contaminated with grinding swarf.

As described above, according to the present invention, when the rear surface of the semiconductor wafer is ground, the outer circumferential portion of the semiconductor wafer and the surface protective tape are bonded to each other, thereby making it possible to fill the gap between the surface protective tape and each scribe line formed on the front surface of the semiconductor wafer, prevent the grinding wafer from penetrating into the gap when the rear surface of the semiconductor wafer is ground, and prevent the scribe lines and the front surface of the semiconductor chip from being contaminated with the grinding swarf.

DETAILED DESCRIPTION OF THE PREFERRED EMBODIMENTS

Hereinafter, the present invention will be described with reference to the attached drawings.

Figure 1:
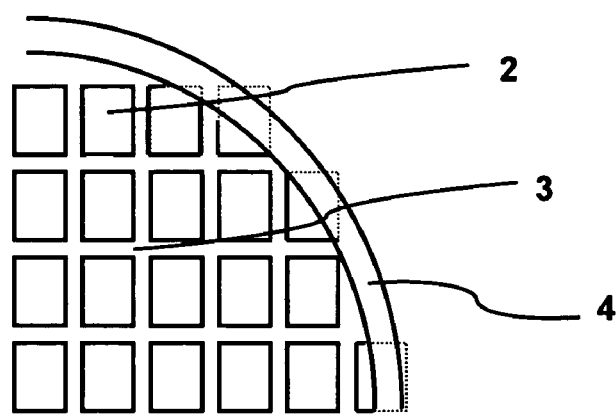
FIG. 1 is a diagram showing a semiconductor wafer in which semiconductor chips are mounted by a method of manufacturing a semiconductor device according to a first embodiment of the present invention.

FIG. 1 is a top view showing an upper surface of a semiconductor wafer in which semiconductor chips are mounted according to an embodiment of the present invention. As shown in FIG. 1, semiconductor chips 2 are mounted on a semiconductor wafer 1 in a wafer process, and at last, the semiconductor chips are covered, for protection thereof, with a passivation film, for example, a photosensitive polyimide resin film. Numeral 3 shows a scribe line and numeral 4 shows an outer circumferential portion of the semiconductor wafer. The photosensitive polyimide resin film can be formed with a use of a spin-coating device. Then, the semiconductor wafer 1 is set in an exposure device to transfer a mask pattern thereto. The semiconductor wafer 1 is subjected to exposure by proximity exposure using a mask made with a ratio of 1:1 with respect to a real pattern. After that, the semiconductor wafer 1 is subjected to a development process and post exposure bake, thereby performing patterning of the polyimide resin film.

Figure 2:
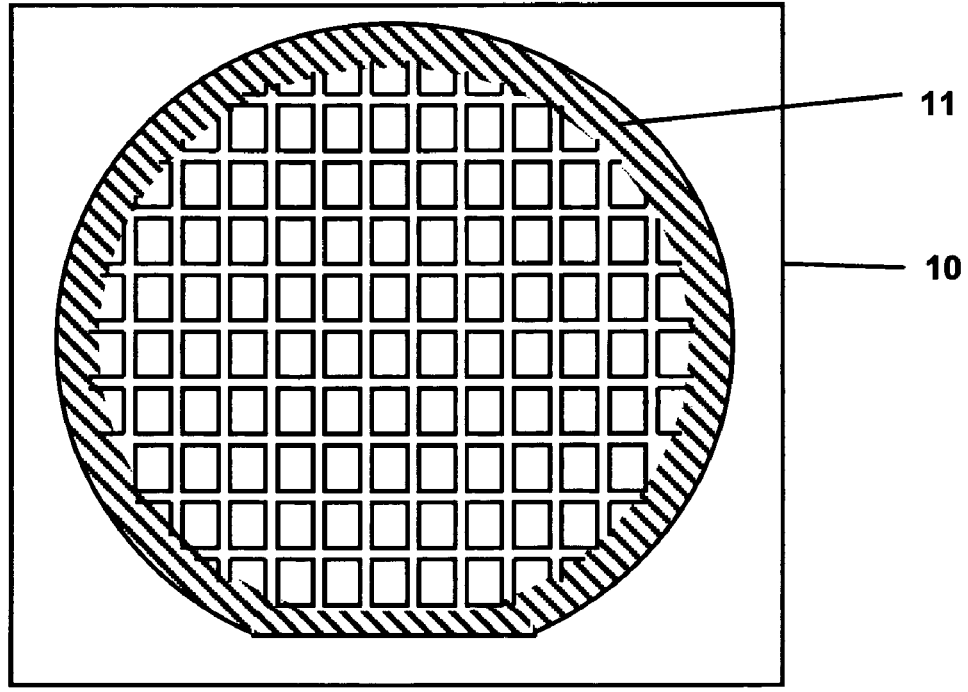
FIG. 2 is a diagram showing a mask arrangement for manufacturing semiconductor chips by the method of manufacturing a semiconductor device according to the first embodiment of the present invention.

According to the embodiment of the present invention, in an exposure process, when a negative photosensitive polyimide is used, a chrome pattern 11 is formed in an arc shape on a mask 10 in advance in order to prevent a portion 4, which is an outer circumferential portion of the semiconductor wafer and has a width of 1 to 2 mm, as shown in FIG. 2, from being subjected to exposure. When a positive photosensitive polyimide is used, a pattern is formed on the mask in advance in an arc shape so that the portion 4, which is the outer circumferential portion of the semiconductor wafer and has the width of 1 to 2 mm, is subjected to exposure. Through the development after exposure, it is possible to remove the polyimide resin film disposed on a peripheral portion of the semiconductor wafer.

In a case of using the positive photosensitive polyimide, instead of performing exposure on the mask, by additionally performing a process of performing exposure on only the peripheral portion of the semiconductor wafer in an arc shape after the pattern exposure, it is also possible to remove the polyimide resin film disposed on the peripheral portion of the semiconductor wafer.

By the processes as described above, while the polyimide resin film disposed on the scribe lines is removed, each of the semiconductor chips is protected with the polyimide resin film, thereby removing the polyimide resin film disposed on the outer circumferential portion 4 of the semiconductor wafer 1 irrespective of presence or absence of the semiconductor chip.

In this case, the photosensitive polyimide is described as an example, but a non-photosensitive polyimide may be used to obtain the same configuration. When the non-photosensitive polyimide is used, a photo resist disposed on the non-photosensitive polyimide is subjected to patterning and is used as a mask to perform etching, thereby making it possible to perform patterning of the non-photosensitive polyimide.

Figure 4:
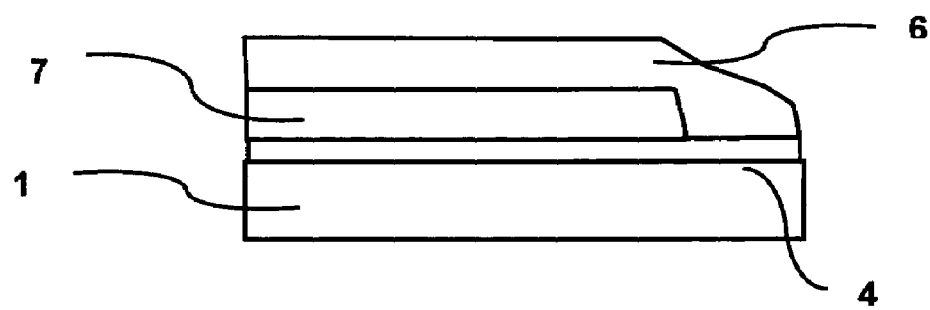
FIG. 4 is an enlarged sectional view of scribe lines formed in an outer circumferential portion of a semiconductor wafer when surface protective tape is bonded to the semiconductor wafer by the method of manufacturing a semiconductor device according to the first embodiment of the present invention.
Figure 5:
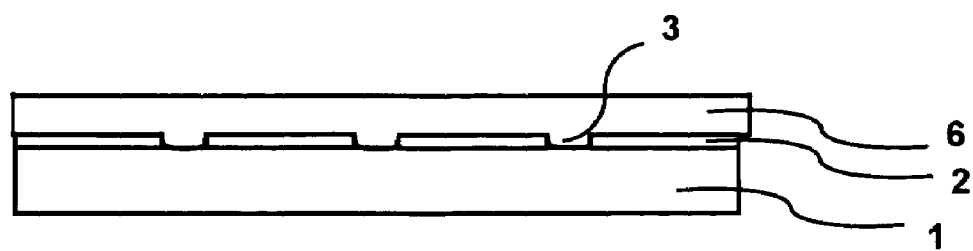
FIG. 5 is an enlarged sectional view of each trench made by scribe lines in an outer circumferential portion of a semiconductor wafer when surface protective tape is bonded to the semiconductor wafer by the method of manufacturing a semiconductor device according to the first embodiment of the present invention.
Figure 6:
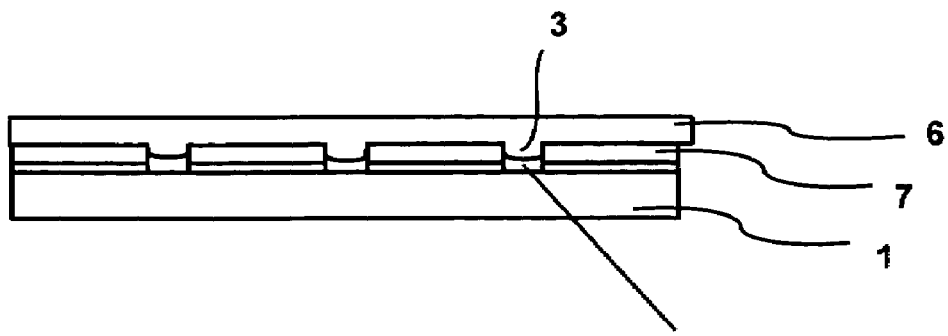
FIG. 6 is an enlarged sectional view of each trench made by scribe lines in an outer circumferential portion of a semiconductor wafer when surface protective tape is bonded to the semiconductor wafer by a method of manufacturing a semiconductor device according to a conventional art.
Figure 7:
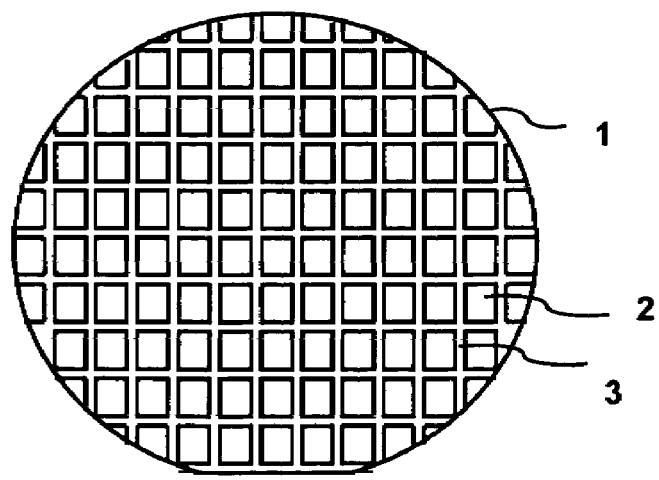
FIG. 7 is a diagram showing a semiconductor wafer in which semiconductor chips are mounted by a method of manufacturing a semiconductor device according to the conventional art.

When the rear surface of the semiconductor wafer 1 is ground, the outer circumferential portion 4 of the semiconductor wafer 1 and the surface protective tape 6 are bonded to each other as shown in FIG. 4, thereby filling the gap between the surface protective tape 6 and the scribe line 3 formed on the front surface of the semiconductor wafer in the outer circumferential portion 4 from which polyimide resin film 7 is removed as shown in FIG. 5. As a result, it is possible to prevent the grinding wafer from penetrating into the gap when the rear surface of the semiconductor wafer is ground, and prevent the scribe lines and the front surface of the semiconductor chip from being contaminated with the grinding swarf.

Figure 3:
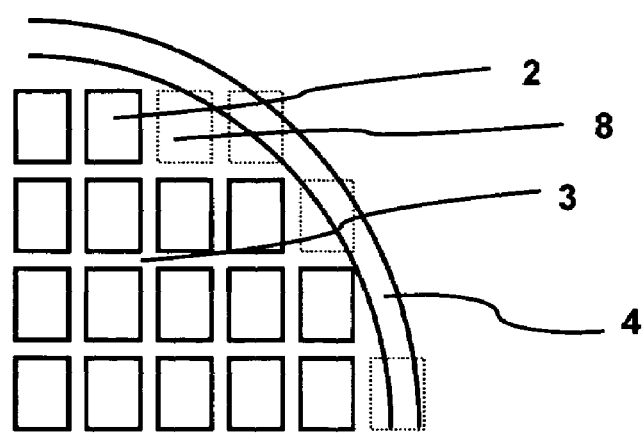
FIG. 3 is a diagram showing a semiconductor wafer in which semiconductor chips are mounted by a method of manufacturing a semiconductor device according to a second embodiment of the present invention.

In addition, according to the embodiment of the present invention, it is possible to perform exposure by the proximity exposure using a mask made with a ratio of 1:1 with respect to the real pattern, so it is possible to completely and easily remove not only the polyimide resin film on the outer circumferential portion 4 of the semiconductor wafer 1 but also the polyimide resin film disposed on a defective chip 8 which is positioned at the outer-most circumferential portion of the semiconductor wafer 1 as shown in FIG. 3. As a result, it is possible to secure a large bonded area in which the outer circumferential portion of the semiconductor wafer and the surface protective tape 6 are bonded to each other, and further prevent the grinding wafer from entering from the peripheral portion of the semiconductor wafer when the rear surface of the semiconductor wafer is ground.

What is claimed is:

1. A method of manufacturing a semiconductor device, comprising the steps of:
   providing a semiconductor wafer having a first main surface, a second main surface opposite the first main surface, an outer circumferential portion, and a plurality of individual semiconductor chips separated by a plurality of scribe lines and arranged on the first main surface;
   forming a passivation film made of a polyimide resin film on the outer circumferential portion and on the first main surface of the semiconductor wafer so as to cover the semiconductor chips and the scribe lines;
   selectively removing the passivation film from the scribe lines and from the outer circumferential portion of the semiconductor wafer but not from the semiconductor chips arranged on the first main surface of the semiconductor wafer;
   bonding a protective tape onto the first main surface of the semiconductor wafer after the removing step; and
   grinding the second main surface of the semiconductor wafer after the bonding step.

2. A method of manufacturing a semiconductor device according to claim 1; wherein the step of selectively removing the passivation film comprises a step of determining a region from which the passivation film is removed by proximity exposure.

3. A method of manufacturing a semiconductor device according to claim 1; further comprising a defective chip disposed on the outer circumferential portion of the semiconductor wafer and on which the passivation film is formed during the forming step; and wherein the step of selectively removing the passivation film further comprises a step of selectively removing the passivation film from the defective chip.

4. A method of manufacturing a semiconductor device according to claim 1; wherein the outer circumferential portion of the semiconductor wafer has a width of 1 to 2 mm.

5. A method of manufacturing a semiconductor device according to claim 1; wherein the polyimide resin film comprises a photosensitive polyimide resin film.

6. A method of manufacturing a semiconductor device according to claim 1; wherein the polyimide resin film comprises a non-photosensitive polyimide resin film.

7. A method of manufacturing a semiconductor device, comprising the steps of:

providing a semiconductor wafer having a front surface bounded by an outer circumferential portion and formed with a plurality of scribe lines separating a plurality of semiconductor chips arranged on the front surface;

forming a protective film on the outer circumferential portion and on the entire front surface of the semiconductor wafer including the scribe lines and the semiconductor chips;

selectively removing the protective film from the outer circumferential portion and the scribe lines of the semiconductor wafer but not from the semiconductor chips arranged on the front surface of the semiconductor wafer;

bonding a protective tape onto the front surface of the semiconductor wafer; and grinding a rear surface of the semiconductor wafer opposite the front surface thereof.

8. A method of manufacturing a semiconductor device according to claim 7; wherein the step of selectively removing the protective film comprises a step of determining a region from which the protective film is removed by proximity exposure.

9. A method of manufacturing a semiconductor device according to claim 7; further comprising a defective chip disposed on the outer circumferential portion of the semiconductor wafer and on which the protective film is formed during the forming step; and wherein the step of selectively removing the protective film further comprises a step of selectively removing the protective film from the defective chip.

10. A method of manufacturing a semiconductor device according to claim 7; wherein the outer circumferential portion of the semiconductor wafer has a width of 1 to 2 mm.

11. A method of manufacturing a semiconductor device according to claim 7; wherein the protective film comprises a polyimide resin film.

12. A method of manufacturing a semiconductor device according to claim 11; wherein the polyimide resin film comprises a photosensitive polyimide resin film.

13. A method of manufacturing a semiconductor device according to claim 11; wherein the polyimide resin film comprises a non-photosensitive polyimide resin film.

14. A method of manufacturing a semiconductor device according to claim 7; wherein the bonding step comprises bonding the protective tape to the outer circumferential portion of the semiconductor wafer.

15. A method of manufacturing a semiconductor device according to claim 1; wherein the bonding step comprises bonding the protective tape to the outer circumferential portion of the semiconductor wafer.

* * * * *